United States Patent
Zhang (10) Patent No.: US 9,525,937 B2
(45) Date of Patent: Dec. 20, 2016

(54) CIRCUIT FOR SUPPRESSING AUDIO OUTPUT NOISE AND AUDIO OUTPUT CIRCUIT

(71) Applicant: Spreadtrum Communications (Shanghai) Co., Ltd., Shanghai (CN)

(72) Inventor: Xun Zhang, Shanghai (CN)

(73) Assignee: SPREADTRUM COMMUNICATIONS (SHANGHAI) CO., LTD., Shanghai (CN)

( * ) Notice: Subject to any disclaimer, the term of this patent is extended or adjusted under 35 U.S.C. 154(b) by 72 days.

(21) Appl. No.: 14/452,685

(22) Filed: Aug. 6, 2014

(65) Prior Publication Data

US 2015/0146884 A1 May 28, 2015

(30) Foreign Application Priority Data

Nov. 26, 2013 (CN) .......................... 2013 1 0611803

(51) Int. Cl.
*H04B 15/00* (2006.01)
*H04R 3/00* (2006.01)
(Continued)

(52) U.S. Cl.
CPC ............ *H04R 3/002* (2013.01); *H03F 1/0277* (2013.01); *H03F 1/26* (2013.01); *H03F 1/305* (2013.01); *H03F 3/181* (2013.01); *H03F 3/20* (2013.01); *H03F 3/211* (2013.01); *H03F 3/2171* (2013.01); *H03F 3/2178* (2013.01);
(Continued)

(58) Field of Classification Search
CPC .......... H03F 1/0277; H03F 1/26; H03F 1/305; H03F 2203/21142; H03F 2203/21175; H03F 2203/45361; H03F 2203/45371; H03F 2203/45396; H03F 2203/45646; H03F 2203/45648; H03F 2203/45726; H03F 3/181; H03F 3/20; H03F 3/211; H03F 3/2171; H03F 3/2178; H03F 3/45179; H03F 3/45183; H03F 3/72; H04R 3/002; H04R 3/02
(Continued)

(56) References Cited

U.S. PATENT DOCUMENTS 6,351,189 B1 * 2/2002 Hirvilampi ........... H03F 1/0261
330/296
6,426,664 B1 * 7/2002 Fujiwara .................. H03G 7/06
327/309

(Continued)

*Primary Examiner* — Khai N Nguyen
(74) *Attorney, Agent, or Firm* — Cantor Colburn LLP (57) ABSTRACT

A circuit for suppressing audio output noise and an audio output circuit are provided. The circuit for suppressing audio output noise includes: a detecting circuit, configured to detect output voltages of output stages of an audio power amplifier; a control circuit, configured to output at least one control signal, the control signal is related to detection results of the detecting circuit; and a compensating circuit, configured to compensate at least one output stage of the audio power amplifier which includes a differential circuit based on the at least one control signal output by the control circuit, to make parameters of the differential circuit symmetrical or approach symmetrical. Based on detection results of the output stage voltages, the differential circuit in the output stages of the audio power amplifier is compensated. The circuit for suppressing audio output noise has a wider application scope and it is easy to design the circuit.

17 Claims, 4 Drawing Sheets

(51) Int. Cl.
*H03F 1/26* (2006.01)
*H04R 3/02* (2006.01)
*H03F 3/181* (2006.01)
*H03F 3/20* (2006.01)
*H03F 1/02* (2006.01)
*H03F 1/30* (2006.01)
*H03F 3/21* (2006.01)
*H03F 3/217* (2006.01)
*H03F 3/45* (2006.01)
*H03F 3/72* (2006.01)

(52) U.S. Cl.
CPC ..... *H03F 3/45179* (2013.01); *H03F 3/45183* (2013.01); *H03F 3/72* (2013.01); *H04R 3/02* (2013.01); *H03F 2203/21142* (2013.01); *H03F 2203/21175* (2013.01); *H03F 2203/45361* (2013.01); *H03F 2203/45371* (2013.01); *H03F 2203/45396* (2013.01); *H03F 2203/45646* (2013.01); *H03F 2203/45648* (2013.01); *H03F 2203/45726* (2013.01)

(58) Field of Classification Search
USPC ........................................................ 381/94.5
See application file for complete search history.

(56) References Cited

U.S. PATENT DOCUMENTS

| | | | | |
|---|---|---|---|---|
| 6,429,746 | B1* | 8/2002 | Koukkari | H03F 1/301 330/285 |
| 8,159,299 | B2* | 4/2012 | Gribben | H03F 3/217 330/251 |
| 9,020,165 | B2* | 4/2015 | Viegas | H04B 15/00 381/94.5 |
| 2003/0185409 | A1* | 10/2003 | Shimotoyodome | H03G 3/348 381/94.1 |
| 2007/0164821 | A1* | 7/2007 | Sandquist | H03F 1/3217 330/268 |
| 2008/0024213 | A1* | 1/2008 | Magrath | H03F 1/305 330/96 |
| 2011/0248781 | A1* | 10/2011 | Gribben | H03F 1/305 330/251 |
| 2013/0154863 | A1* | 6/2013 | Ho | H03F 3/265 341/143 |
| 2014/0098974 | A1* | 4/2014 | Viegas | H04B 15/00 381/94.5 |
| 2015/0256925 | A1* | 9/2015 | Lesso | H04R 3/00 381/123 |

* cited by examiner

CIRCUIT FOR SUPPRESSING AUDIO OUTPUT NOISE AND AUDIO OUTPUT CIRCUIT

CROSS-REFERENCE TO RELATED APPLICATIONS

The present application claims priority to Chinese patent application No. 201310611803.6, filed on Nov. 26, 2013, and entitled "CIRCUIT FOR SUPPRESSING AUDIO OUTPUT NOISE AND AUDIO OUTPUT CIRCUIT", and the entire disclosure of which is incorporated herein by reference.

TECHNICAL FIELD

The present disclosure generally relates to audio output technology field, and more particularly, to a circuit for suppressing audio output noise and an audio output circuit.

BACKGROUND

In an audio power amplifier for driving a loudspeaker, when a power supply of the amplifier is turned on/off, a strange transient noise, such as a pop noise, may be generated by an audio transient signal in the loudspeaker. To avoid such transient noises, in some solutions, a noise suppressing circuit is provided at an output terminal of the audio power amplifier, which avoids output transient noise resulted from component properties of an output circuit between the audio power amplifier and the loudspeaker.

However, existing noise suppressing circuits are designed based on analysis of an output circuit. There are various types of audio power amplifier, such as class A, class B, class AB, class D, class G and class H, which have different output circuits between the audio power amplifiers and loudspeakers. Besides, some audio power amplifiers do not have an output circuit. For example, a class G audio power amplifier can be directly connected with a loudspeaker. Therefore, the existing noise suppressing circuits, which have complicated circuit design, have limited application scopes.

SUMMARY

In embodiments of the present disclosure, a circuit for suppressing audio output noise and an audio output circuit are provided, which may have a wide application scope with simpler circuit design.

In an embodiment, a circuit for suppressing audio output noise is provided, including:

a detecting circuit, configured to detect output voltage values of output stages of an audio power amplifier;

a control circuit, configured to output at least one control signal, the control signal is related to detection results of the detecting circuit; and a compensating circuit, configured to compensate at least one output stage of the audio power amplifier which includes a differential circuit based on the at least one control signal output by the control circuit, to make parameters of the differential circuit symmetrical or approach symmetrical.

Optionally, the circuit for suppressing audio output noise may further include: a detecting output stage, configured to be connected with an output stage of the audio power amplifier; and a detecting load, configured to be connected with the detecting output stage, where the detecting circuit is connected with the detecting output stage and configured to compare an output voltage value of the detecting output stage with a reference voltage value to output a detection result, and the compensating circuit is configured to compensate at least one output stage before the output stage.

Optionally, the detecting output stage may be connected with an output stage next to an end output stage of the audio power amplifier.

Optionally, the detecting circuit may be connected with the end output stage of the audio power amplifier and configured to compare an output voltage value of the end output stage with a reference voltage value to output a detection result.

Optionally, the detecting circuit may include a voltage comparing circuit, configured to compare the output voltage values with a reference voltage value to output the detection results.

Optionally, the compensating circuit may include at least one compensating component, where the control signal is configured to control the compensating component to connect with a corresponding branch in the differential circuit.

Optionally, the compensating circuit may include at least one compensating component which corresponds to one branch of the differential circuit and at least one compensating component which corresponds to another branch of the differential circuit, where connection between the compensating components and the corresponding branches in the differential circuit may be controlled by a corresponding control signal.

Optionally, the compensating component may be a transistor, where the transistor may be controlled to be connected in parallel with a differential transistor in a corresponding branch by a corresponding control signal.

Optionally, the compensating component may be a resistor, where the resistor may be controlled to be connected in parallel with a differential transistor in a corresponding branch by a corresponding control signal.

Optionally, the compensating component may be a current source, where the current source may be controlled to be connected in parallel with another current source in a corresponding branch by a corresponding control signal.

Optionally, the compensating component may be a current source, where one end of the current source may be controlled to be connected with another current source and a differential transistor in a corresponding branch by a corresponding control signal, and the other end of the current source may be grounded.

Optionally, the control circuit may be configured to determine which branch in the differential circuit of the at least one compensated output stage to be compensated based on the detection results, and to set a logical value for the control signal.

Optionally, the audio power amplifier may be a class G audio power amplifier.

In an embodiment, an audio output circuit is provided, including an audio power amplifier, a loudspeaker and the circuit for suppressing audio output noise which is provided in the above embodiment.

Optionally, the loudspeaker may be an earphone or a bugle.

In embodiments of the present disclosure, based on detection results of output stage voltages, a differential circuit in output stages of an audio power amplifier is compensated to make parameters of the differential circuit symmetrical or approach symmetrical, so that an output voltage of the audio power amplifier can reach zero or nearly zero, and thus transient noises are suppressed when a power supply of the audio power amplifier is turned on/off. Generally, an audio power amplifier includes a differential circuit, thus, circuits for suppressing audio output noise provided in embodiments of the present disclosure may be widely applied in audio output circuits and are suitable in various types of audio power amplifiers. Besides, it is easy to design the circuits for suppressing audio output noise according to embodiments of the present disclosure.

Further, a detecting output stage and a detecting load are used to simulate output of the output stages of the audio power amplifier, an output voltage of the detecting output stage is detected, and compensation is performed based on the detection results, so that the actual output of the audio power amplifier is not affected by the compensation and debugging processes of the audio power amplifier, and further a loudspeaker may not make noises influencing audio experience of a user.

DETAILED DESCRIPTION

An audio power amplifier generally includes at least one output stage, and the output stage generally includes a differential amplify circuit (hereinafter referred to differential circuit). In an ideal differential circuit, circuit parameters are symmetrical. When an input signal is zero, output voltages at two ends of the ideal differential circuit are also zero. However, in practice, a limited mismatch may exist between components even with a same nominal value due to uncertainty of manufacturing processes, which may lead to non-zero output for zero input, namely, differential circuit imbalance. Mismatch resulted from manufacturing processes is highly dependent on manufacturing and layout, for example, gates of two Metal-Oxide-Semiconductor (MOS) transistors with same parameters may have randomly and slightly different sizes in manufacturing, which leads to a mismatch of the two MOS transistors in gate length or gate width.

Based on the above analysis, in embodiments of the present disclosure, a differential circuit in output stages of an audio power amplifier is compensated based on detection results of output stage voltage, to make parameters of the differential circuit symmetrical or approach symmetrical, so that an output voltage of the audio power amplifier can reach zero or nearly zero when a power supply of the audio power amplifier is turned on/off. Embodiments of the present disclosure may be described in detail in conjunction with accompany drawings.

Figure 1:
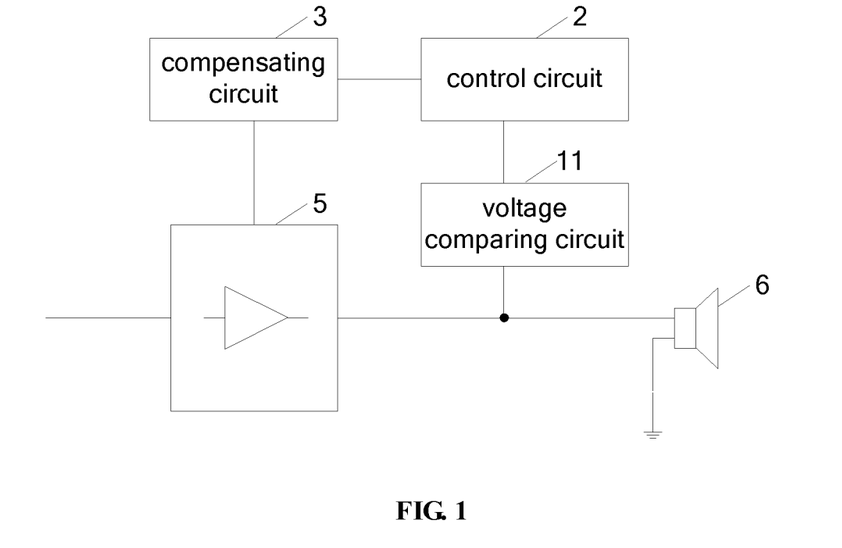
FIG. 1 schematically illustrates a structural diagram of an audio output circuit according to some embodiments of the present disclosure.

FIG. 1 schematically illustrates a structural diagram of an audio output circuit according to some embodiments of the present disclosure. The audio output circuit includes an audio power amplifier 5, a loudspeaker 6 and a circuit for suppressing audio output noise (not marked in the figures).

The audio power amplifier 5 includes at least one output stage and a plurality of output stage cascades. At least one output stage includes a differential circuit. The audio power amplifier 5 may be a class G audio power amplifier, or other audio power amplifier which has a differential circuit therein. The loudspeaker 6 may be an earphone or a bugle.

The circuit for suppressing audio output noise includes a voltage comparing circuit 11, a control circuit 2 and a compensating circuit 3.

The voltage comparing circuit 11, as a detecting circuit, is configured to detect output voltage values of an end output stage of the audio power amplifier 5 (i.e., an output end of the audio power amplifier 5). The voltage comparing circuit 11 is connected with the end output stage and configured to compare the output voltage value of the end output stage with a reference voltage value to output a detection result. Existing circuits may be employed as the voltage comparing circuit 11. The reference voltage value may be set to be zero or approach zero. The reference voltage may be an empirical value. When an input of the audio power amplifier is zero and an output is greater than a value which approaches zero, pop noise may be generated by the loudspeaker 6 and heard by people. Therefore, in some embodiments, the reference voltage value may be set to be zero or approach zero.

The control circuit 2 is connected with the voltage comparing circuit 11, and configured to output at least one control signal, the control signal being related to detection results of the voltage comparing circuit 11.

The compensating circuit 3 is configured to compensate at least one output stage of the audio power amplifier 5 which includes a differential circuit, based on the at least one control signal output by the control circuit 2, to make parameters of the differential circuit symmetrical or approach symmetrical. In some embodiments, the compensating circuit 3 may be configured to compensate any one or more output stage of the audio power amplifier 5 which includes a differential circuit.

It should be noted that, in some embodiments, the voltage comparing circuit 11 as the detecting circuit may be not configured to detect the output voltage values of the end output stage of the audio power amplifier 5, but connected with any other output stage of the audio power amplifier 5 and configured to detect output voltage values of the connected output stage. Correspondingly, the compensating circuit 3 may be configured to compensate the output stage detected by the detecting circuit and any one or more output stages before the detected output stage which includes a differential circuit, to correct an error of the detected output stage and the one or more output stages before the detected output stage.

Figure 2:
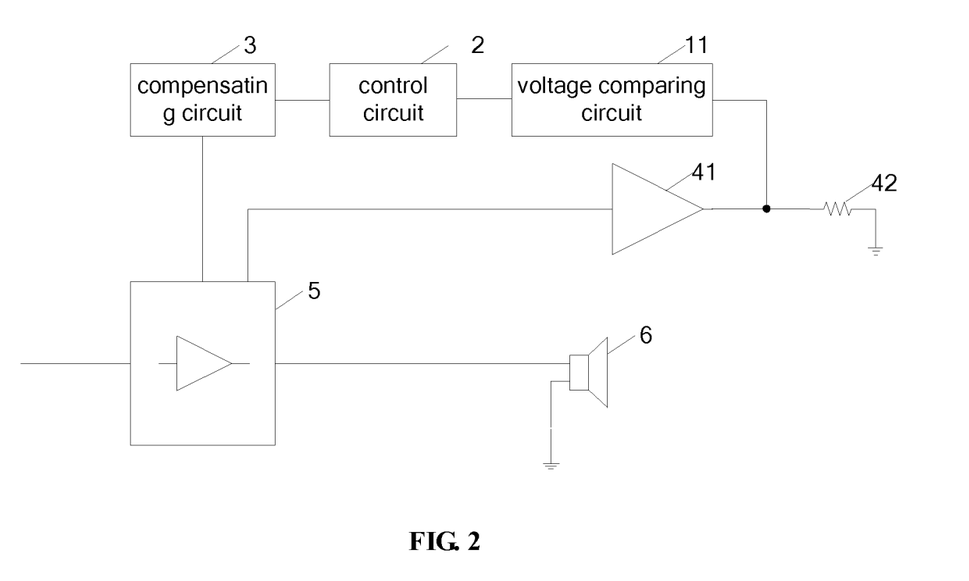
FIG. 2 schematically illustrates a structural diagram of an audio output circuit according to some embodiments of the present disclosure.

FIG. 2 schematically illustrates a structural diagram of an audio output circuit according to some embodiments of the present disclosure. The audio output circuit includes the audio power amplifier 5, the loudspeaker 6 and the circuit for suppressing audio output noise.

The audio power amplifier 5 includes at least one output stage and a plurality of output stage cascades. At least one output stage includes a differential circuit. The loudspeaker 6 may be an earphone or a bugle. The audio power amplifier 5 may be an audio power amplifier which has a differential circuit therein, such as a class G audio power amplifier.

The circuit for suppressing audio output noise includes the voltage comparing circuit 11, the control circuit 2, the compensating circuit 3, a detecting output stage 41 and a detecting load 42.

The voltage comparing circuit 11 as a detecting circuit may be configured to detect output voltage values of an output stage of the audio power amplifier 5. The voltage comparing circuit 11 may be configured to compare the output voltage value of the output stage with a reference voltage value to output a detection result. Existing circuits may be employed as the voltage comparing circuit 11. The reference voltage value may be set to be zero or approach zero.

The control circuit 2 is connected with the voltage comparing circuit 11, and configured to output at least one control signal, the control signal being related to detection results of the voltage comparing circuit 11.

The compensating circuit 3 is configured to compensate at least one output stage of the audio power amplifier 5 which includes a differential circuit based on the at least one control signal output by the control circuit 2, to make parameters of the differential circuit symmetrical or approach symmetrical.

The detecting output stage 41 is connected with one output stage of the audio power amplifier 5. The detecting load 42 is connected with the detecting output stage 41. The detecting output stage 41 and the detecting load 42 are configured to simulate output of output stages of the audio power amplifier 5.

In some embodiments, the voltage comparing circuit 11 may be connected with the detecting output stage 41 and configured to compare an output voltage value of the detecting output stage 41 with a reference voltage value to output a detecting result. Since the detecting output stage 41 is connected with one output stage of the audio power amplifier 5, the detecting output stage 41 and the detecting load 42 can simulate output of an output stage after the output stage connected with the detecting output stage 41. As a result, detecting the output voltage value of the detecting output stage 41 may be equal to detecting an output voltage value of the output stage after the output stage connected with the detecting output stage 41. The compensating circuit 3 may be configured to compensate the output stage connected with the detecting output stage 41 and at least one output stage before the output stage connected with the detecting output stage 41, that is, the compensating circuit 3 may compensate any one or more output stage which is cascaded before the detecting output stage 41 and has a differential circuit. Therefore, the compensating circuit 3 can correct an error of the output stage connected with the detecting output stage 41 and at least one output stage before the output stage connected with the detecting output stage 41.

The detecting output stage and the detecting load are used to simulate output of the output stages of the audio power amplifier, the output voltage of the detecting output stage is detected, and compensation is performed based on the detection result, so that the actual output of the audio power amplifier is not affected by compensation and processes of the audio power amplifier, and further a loudspeaker may not make noises influencing aural experience of a user.

Figure 3:
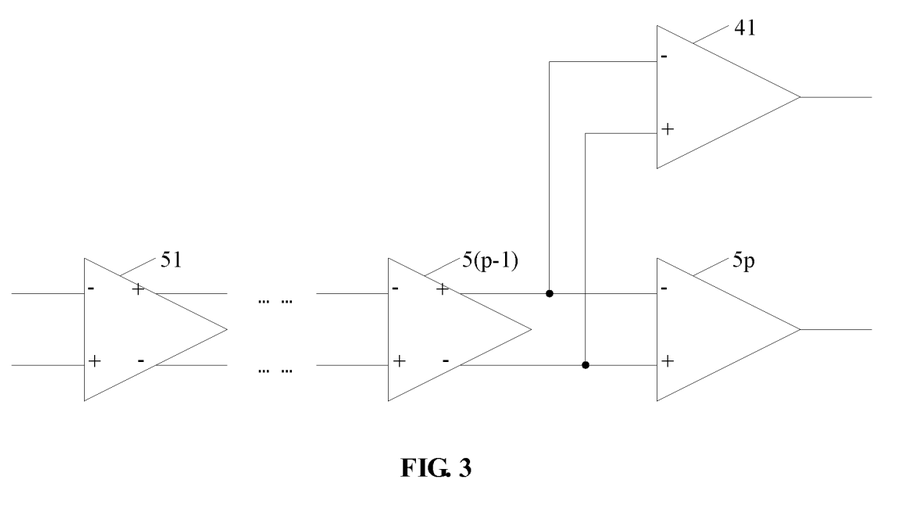
FIG. 3 schematically illustrates a structural diagram of connection between an audio power amplifier and a detecting output stage in an audio output circuit according to some embodiments of the present disclosure.

FIG. 3 schematically illustrates a structural diagram of connection between the detecting output stage 41 and the audio power amplifier 5 in the audio output circuit shown in FIG. 2.

The audio power amplifier 5 includes a number of p output stages 51, ..., 5(p−1), 5p, and p>=2, where the first output stage 51 to the 5(p−1) output stage are dual-terminal input and dual-terminal output amplifiers and the $p^{th}$ output stage, i.e., an end output stage 5p are dual-terminal input and single-terminal output amplifiers. The p output stages 51, ..., 5(p−1) and 5p are cascaded in turn, where a positive phase terminal of each output stage is connected with a negative phase terminal of its adjacent output stage, and each output stage includes a differential circuit.

The detecting output stage 41 is a dual-terminal input and single-terminal output amplifier. The detecting output stage 41 is connected with an output stage 5(p−1) before the end output stage 5p, and the connection between the detecting output stage 41 and the output stage 5(p−1) is the same as the connection between the end output stage 5p and the output stage 5(p−1). The detecting output stage 41 and the detecting load 42 are used to simulate output of the end output stage. A circuit structure of the detecting output stage 41 and an impedance of the detecting load 42 may be determined based on driving ability of the end output stage 5p and an impedance of the loudspeaker. For example, if the output impedance of the loudspeaker is 32 Ω and the driving ability of the end output stage 5p is 100 mA, an external circuit with an impedance of 32 Ω and driving ability of 100 mA may be employed as the detecting output stage 41. To save power consumption, an external circuit with an impedance of 3.2 kΩ and driving ability of 1 mA may be employed as the detecting output stage 41.

Based on the connection structure shown in FIG. 3, the compensating circuit 3 in FIG. 2 may be configured to compensate at least one output stage before the end output stage in the audio power amplifier 5. That is, the compensating circuit 3 may be configured to compensate a differential circuit in one or more of the first output stage 51 to the $(p-1)^{th}$ output stage 5(p−1).

It should be noted that, FIG. 3 is only illustrated as an example. Those skilled in the art may understand, the structure of the audio power amplifier is not limited to FIG. 3. Besides, as described in above, the detecting output stage is not limited to connect with an output stage next to the end output stage and may be connected with any one of other output stages.

The control circuit 2 and the compensating circuit 3 may be further described in detail below.

The control circuit 2 may be configured to determine which branch in the differential circuit of the compensated output stage to be compensated based on the detection results of the voltage comparing circuit 11, and to set a logical value for the control signal. In some embodiments, if the voltage comparing circuit 11 determines that the output voltage value is greater than the reference voltage value (called voltage forward biased hereinafter) or the output voltage value is smaller than the reference voltage value (called voltage reverse biased hereinafter), parameters of the differential circuit may be asymmetric. Generally, the uncertainty of manufacturing processes may make parameters of one branch greater or smaller. The parameters may include a current value of a current source in the branch, a size of a differential transistor (for example, a width-to-length ratio of a MOS transistor), or a ratio of the current value to the size.

Therefore, a corresponding value needs to be set to the logic value of the control signal based on predetermined control logic and to control the compensating circuit 3 to compensate branches of the differential circuit.

The compensating circuit 3 includes at least one compensating component, where the control signal is configured to control the compensating component to connect with a corresponding branch in the differential circuit. FIGS. 4 to 7 schematically illustrate structural diagrams of connection between a compensating circuit and a differential circuit in an output stage according to some embodiments of the present disclosure. In some embodiments, the compensating circuit may include at least one compensating component which corresponds to one branch of the differential circuit and at least one compensating component which corresponds to another branch of the differential circuit, where connection between the compensating components and the corresponding branches in the differential circuit may be controlled by a corresponding control signal. Hereinafter, for brevity, the compensating component which corresponds to the one branch of the differential circuit is called a first compensating component, and the compensating component which corresponds to the another branch of the differential circuit is called a second compensating component. It should be noted that, the accompany drawings are only illustrated as examples, and structures of the differential circuit and the compensating circuit are not limited to the accompany drawings. Those skilled in the art may vary and expand the structure of the compensating circuit based on the accompany drawings, description below and various structures of the differential circuit. Besides, for convenience, only the differential circuits in the output stages are illustrated in FIGS. 4 to 7, while other components and circuit structures contained in the output stages are not shown.

Figure 4:
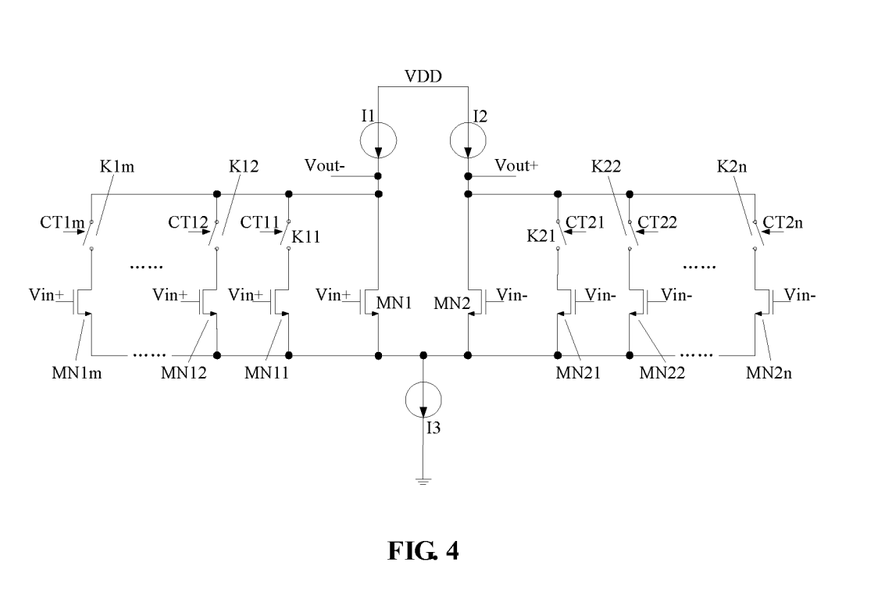
FIG. 4 schematically illustrates a structural diagram of connection between a compensating circuit and a differential circuit in an output stage according to some embodiments of the present disclosure.

Referring to FIG. 4, a first branch of a differential circuit includes a current source I1 and a differential transistor MN1 which are connected in series, and a second branch of the differential circuit includes a current source I2 and a differential transistor MN2 which are connected in series. The differential transistors MN1 and MN2 are N-Mental-Oxide-Semiconductor (NMOS) transistors. A first signal Vin+ is input into a gate electrode of the differential transistor MN1, a second signal Vin− is input into a gate electrode of the differential transistor MN2, a third signal Vout− is output from a drain electrode of the differential transistor MN1, and a fourth signal Vout+ is output from a drain electrode of the differential transistor MN2. Source electrodes of the differential transistors MN1 and MN2 are grounded through a current source I3.

The compensating circuit includes m first compensating components and n second compensating components, $m \geq 1$, $n \geq 1$, and m and n may have a same value or different values. The first compensating components correspond to a first branch and are connected with the first branch through corresponding switches. In some embodiments, the first compensating components are NMOS compensating transistors. A NMOS compensating transistor MN11 is connected with the first branch through a switch K11, a NMOS compensating transistor MN12 is connected with the first branch through a switch K12, . . . , and a NMOS compensating transistor MN1$m$ is connected with the first branch through a switch K1$m$. The first signal Vin+ is input into gate electrodes of the NMOS compensating transistors MN11, MN12, . . . , and MN1$m$. The second compensating components correspond to a second branch and are connected with the second branch through corresponding switches. In some embodiments, the second compensating components are NMOS compensating transistors. A NMOS compensating transistor MN21 is connected with the second branch through a switch K21, a NMOS compensating transistor MN22 is connected with the second branch through a switch K22, . . . , and a NMOS compensating transistor MN2$n$ is connected with the second branch through a switch K2$n$. The second signal Vin− is input into gate electrodes of the NMOS compensating transistors MN21, MN22, . . . , and MN2$n$.

In some embodiments, a size of the NMOS compensating transistors MN11, MN12, . . . , and MN1$m$ and a size of the NMOS compensating transistors MN21, MN22, . . . , and MN2$n$ are smaller than a size of the differential transistors MN1 and MN2. Sizes of the NMOS compensating transistors may be the same or different. In some embodiments, the sizes of the NMOS compensating transistors may be set according to requirements of compensating accuracy. For example, a ratio of the size of the NMOS compensating transistor to the size of the differential transistor may be 1:100, 2:100, 3:100, . . . , 1:10 or etc.

The switches K11, K12, . . . , and K1$m$ are controlled by control signals CT11, CT12, . . . , and CT1$m$ respectively, and the switches K21, K22, . . . , and K2$n$ are controlled by control signals CT21, CT22, . . . , and CT2$m$ respectively. If a logic value of the control signal is a first value (for example, logic value 1), the corresponding switches are turned on and the corresponding compensating components are connected into the corresponding branch. If a logic value of the control signal is a second value (for example, logic value 0), the corresponding switches are turned off and the corresponding compensating components are not connected with the corresponding branch.

In some embodiments, the logic values of the control signals may be determined based on predetermined control logic by a control circuit, while the predetermined control logic is related to a detection result of a detecting circuit, a connecting structure between compensating components and a differential circuit, and a stage number of a compensated output stage (i.e., the output stage connected with a compensating circuit). Furthermore, as output stages of an audio power amplifier are cascaded, when the detection result is voltage forward biased, compensation may be performed on odd-stage output stages or even-stage output stages and a branch determined to be compensated may be different. Similarly, when the detection result is voltage reverse biased, compensation may be performed on odd-stage output stages or even-stage output stages and a branch determined to be compensated may be different as well. Therefore, after a circuit design is determined, which output stage is connected with the compensating circuit is determined, and a connecting structure between the compensating components and the differential circuit is determined as well. Based on the detection result of the detecting circuit, whether parameters of the first or second branch in the compensated output stages are smaller may be determined In this way, which branch needs to be compensated may be determined when voltage forward bias or voltage reverse bias occurs. And control signal may be determined to control the compensating components to compensate the branch which needs to be compensated. After the branch to be compensated is determined, the logic value of the control signal may be set by logic design, such as look-up table or state machine.

Referring to the connecting structure in FIG. 4, for example, if it is determined that the second branch needs to be compensated according to the detection result, it is supposed that the reason may include a ratio of a size of the differential transistor MN2 to a current value of the current source I2 in the second branch is smaller than a ratio of a size of the differential transistor MN1 to a current value of the current source I1 in the first branch. Thus, a logic value of at least one of the control signals CT21, CT22, . . . , and CT2n may be determined as a first value, controlling at least one of the NMOS compensating transistors MN21, MN22, . . . , and MN2n to be connected in parallel with the differential transistor MN2 in the second branch. Voltage detection and branch compensation may be performed repeatedly, until an output voltage value equals to a reference voltage value or a smallest compensating accuracy of circuit design is achieved. During the voltage detection and branch compensation, the logic values of the control signals may be determined according to voltage detection results, to adjust the number of the compensating transistors which are connected in parallel with the differential transistor in the branch to be compensated and/or adjust the number of the compensating transistors which are connected in parallel with the differential transistor in the branch not to be compensated, which makes ratios of a size of the transistor to a current value of the current source in two branches equal or approach equal.

Figure 5:
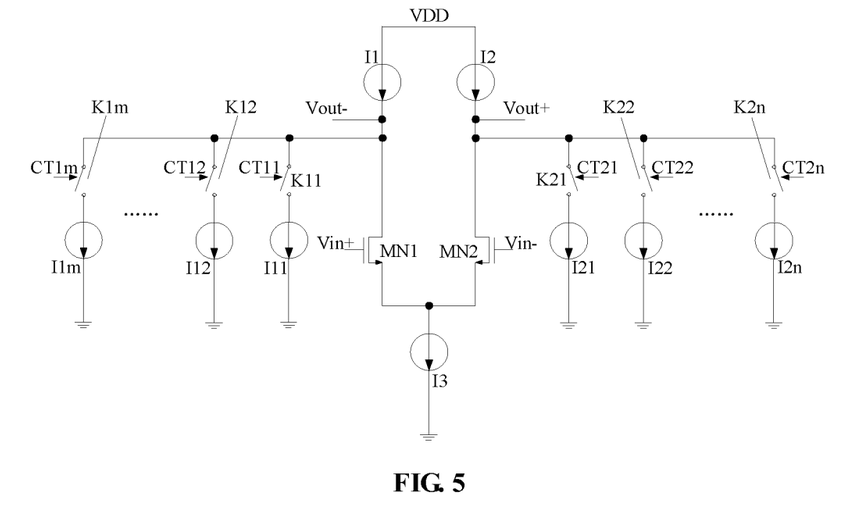
FIG. 5 schematically illustrates a structural diagram of connection between a compensating circuit and a differential circuit in an output stage according to some embodiments of the present disclosure.

FIG. 5 schematically illustrates a structural diagram of connection between a compensating circuit and a differential circuit according to some embodiments of the present disclosure. The differential circuit has a same structure with that in FIG. 4.

The compensating circuit includes m first compensating components and n second compensating components, m>=1, n>=1, and m and n may have a same value or different values. The first compensating components correspond to a first branch and are connected with the first branch through corresponding switches. In some embodiments, the first compensating components are compensating current sources. One end of a compensating current source I11 is connected with the first branch through a switch K11, one end of a compensating current source I12 is connected with the first branch through a switch K12, . . . , and one end of a compensating current source I1m is connected with the first branch through a switch K1m. The other ends of the compensating current sources I11, I12, . . . , and I1m are grounded. The second compensating components correspond to a second branch and are connected with the second branch through corresponding switches. In some embodiments, the second compensating components are compensating current sources. One end of a compensating current source I21 is connected with the second branch through a switch K21, one end of a compensating current source I22 is connected with the second branch through a switch K22, . . . , and one end of a compensating current source I2n is connected with the second branch through a switch K2n. The other ends of the compensating current sources I21, I22, . . . , and I2n are grounded.

In some embodiments, current values of the compensating current sources I11, I12, . . . , and I1m and current values of the compensating current sources I21, I22, . . . , and I2n are smaller than current values of the current sources I1 and I2. The current values of the compensating current sources may be the same or different. In some embodiments, the current values of the compensating current sources may be set according to requirements of compensating accuracy. For example, a ratio of the current value of the compensating current source to the current value of the current source in the branch may be 1:100, 2:100, 3:100, . . . , 1:10 or etc.

The switches K11, K12, . . . , and K1m are controlled by control signals CT11, CT12, . . . , and CT1m respectively, and the switches K21, K22, . . . , and K2n are controlled by control signals CT21, CT22, . . . , and CT2m respectively. If a logic value of the control signal is a first value, the corresponding switches are turned on and the corresponding compensating components are connected into the corresponding branch. If a logic value of the control signal is a second value, the corresponding switches are turned off and the corresponding compensating components are not connected with the corresponding branch.

In some embodiments, the logic values of the control signals may be determined based on predetermined control logic by a control circuit. More information about this can be found in the above description of FIG. 4.

Referring to the connecting structure in FIG. 5, for example, if it is determined that the second branch needs to be compensated according to the detection result, it is supposed that the reason may include a ratio of a size of the differential transistor MN2 to a current value of the current source I2 in the second branch is smaller than a ratio of a size of the differential transistor MN1 to a current value of the current source I1 in the first branch. Thus, a logic value of at least one of the control signals CT21, CT22, . . . , and CT2n may be determined as a first value, controlling one end of at least one of the compensating current sources I21, I22, . . . , and I2n to be connected with the current source and a drain electrode of the differential transistor MN2 in the second branch. Voltage detection and branch compensation may be performed repeatedly, until an output voltage value equals to a reference voltage value or a smallest compensating accuracy of circuit design is achieved. During the voltage detection and branch compensation, the logic values of the control signals may be determined according to voltage detection results, to adjust the number of the compensating current sources which are connected with the branch to be compensated and/or adjust the number of the compensating current sources which are connected with the branch not to be compensated, which makes ratios of a size of the transistor to a current value of the current source in two branches equal or approach equal.

Figure 6:
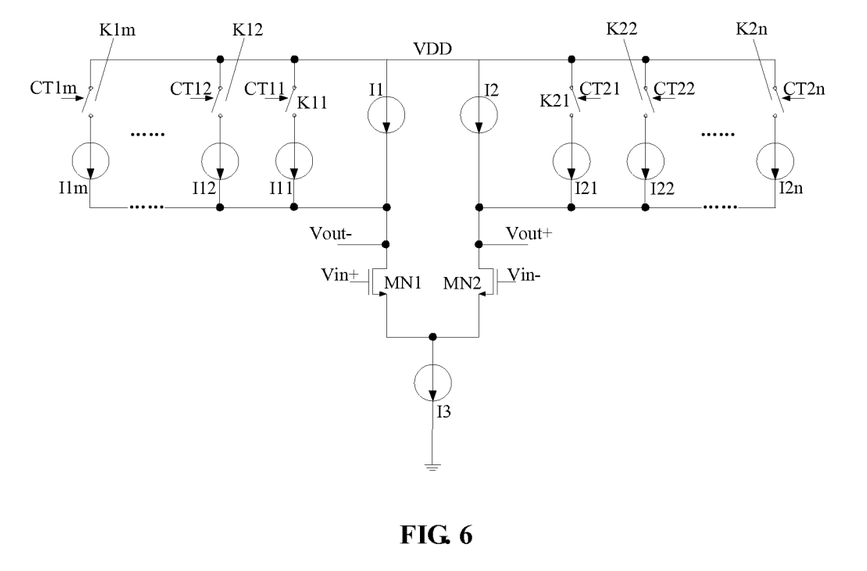
FIG. 6 schematically illustrates a structural diagram of connection between a compensating circuit and a differential circuit in an output stage according to some embodiments of the present disclosure.

FIG. 6 schematically illustrates a structural diagram of connection between a compensating circuit and a differential circuit according to some embodiments of the present disclosure. The differential circuit has a same structure with that in FIG. 4.

The compensating circuit includes m first compensating components and n second compensating components, m>=1, n>=1, and m and n may have a same value or different values. The first compensating components correspond to a first branch and are connected with the first branch through corresponding switches. In some embodiments, the first compensating components are compensating current sources. A compensating current source I11 is connected in parallel with a current source I1 of the first branch through a switch K11, a compensating current source I12 is connected in parallel with the current source I1 of the first branch through a switch K12, . . . , and a compensating current source I1m is connected in parallel with the current source I1 of the first branch through a switch K1m. The second compensating components correspond to a second branch and are connected with the second branch through corresponding switches. In some embodiments, the second compensating components are compensating current sources. A compensating current source I21 is connected in parallel with a current source I2 of the second branch through a switch K21, a compensating current source I22 is connected in parallel with the current source I2 of the second branch through a switch K22, . . . , and a compensating current source I2n is connected in parallel with the current source I2 of the second branch through a switch K2n.

In some embodiments, current values of the compensating current sources I11, I12, . . . , and I1m and current values of the compensating current sources I21, I22, . . . , and I2n are smaller than current values of the current sources I1 and I2. The current values of the compensating current sources may be the same or different. In some embodiments, the current values of the compensating current sources may be set according to requirements of compensating accuracy. For example, a ratio of the current value of the compensating current source to the current value of the current source in the branch may be 1:100, 2:100, 3:100, . . . , 1:10 or etc.

The switches K11, K12, . . . , and K1m are controlled by control signals CT11, CT12, . . . , and CT1m respectively, and the switches K21, K22, . . . , and K2n are controlled by control signals CT21, CT22, . . . , and CT2m respectively. If a logic value of the control signal is a first value, the corresponding switches are turned on and the corresponding compensating components are connected into the corresponding branch. If a logic value of the control signal is a second value, the corresponding switches are turned off and the corresponding compensating components are not connected with the corresponding branch.

In some embodiments, the logic values of the control signals may be determined based on predetermined control logic by a control circuit. More information about this can be found in the above description of FIG. 4.

Referring to the connecting structure in FIG. 6, for example, if it is determined that the first branch needs to be compensated according to the detection result, it is supposed that the reason may include a ratio of a current value of the current source I1 to a size of the differential transistor MN1 in the first branch is smaller than a ratio of a current value of the current source I2 to a size of the differential transistor MN2 in the second branch. Thus, a logic value of at least one of the control signals CT11, CT12, . . . , and CT1m may be determined as a first value, controlling at least one of the compensating current sources I11, I12, . . . , and I1m to be connected in parallel with the current source I1 in the first branch. Voltage detection and branch compensation may be performed repeatedly, until an output voltage value equals to a reference voltage value or a smallest compensating accuracy of circuit design is achieved. During the voltage detection and branch compensation, the logic values of the control signals may be determined according to voltage detection results, to adjust the number of the compensating current sources which are connected in parallel with the current source in the branch to be compensated and/or adjust the number of the compensating current sources which are connected in parallel with the current source in the branch not to be compensated, which makes ratios of a current value of the current source to a size of the transistor in two branches equal or approach equal.

Figure 7:
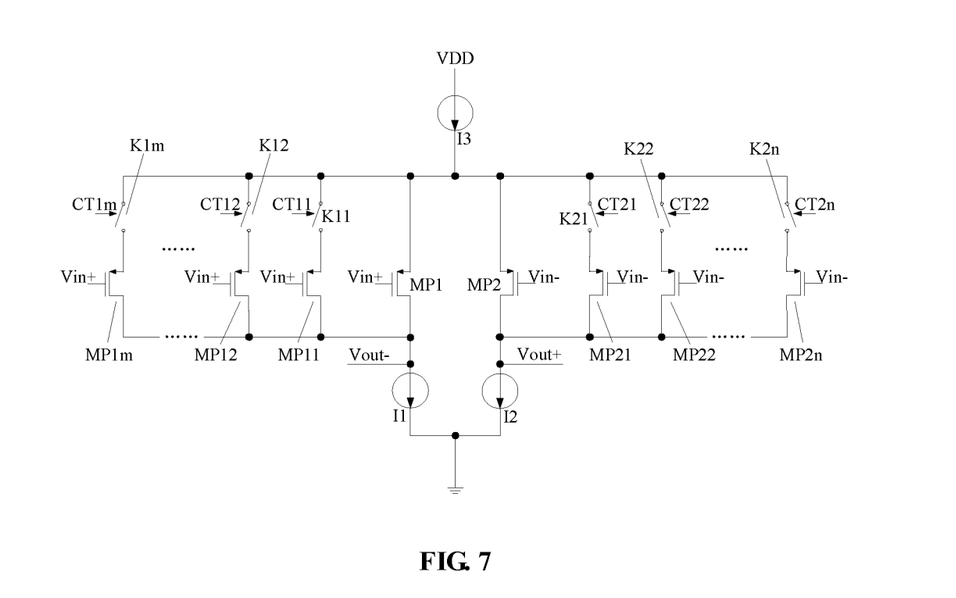
FIG. 7 schematically illustrates a structural diagram of connection between a compensating circuit and a differential circuit in an output stage according to some embodiments of the present disclosure.

FIG. 7 schematically illustrates a structural diagram of connection between a compensating circuit and a differential circuit according to some embodiments of the present disclosure. A first branch of the differential circuit includes a current source I1 and a differential transistor MP1 which are connected in series, and a second branch of the differential circuit includes a current source I2 and a differential transistor MP2 which are connected in series. The differential transistors MP1 and MP2 are P-Mental-Oxide-Semiconductor (PMOS) transistors. A first signal Vin+ is input into a gate electrode of the differential transistor MP1, a second signal Vin− is input into a gate electrode of the differential transistor MP2, a third signal Vout− is output from a drain electrode of the differential transistor MP1, and a fourth signal Vout+ is output from a drain electrode of the differential transistor MP2. Source electrodes of the differential transistors MP1 and MP2 are connected with an operating power supply through a current source I3.

The compensating circuit includes m first compensating components and n second compensating components, m>=1, n>=1, and m and n may have a same value or different values. The first compensating components correspond to a first branch and are connected with the first branch through corresponding switches. In some embodiments, the first compensating components are PMOS compensating transistors. A PMOS compensating transistor MP11 is connected with the first branch through a switch K11, a PMOS compensating transistor MP12 is connected with the first branch through a switch K12, . . . , and a PMOS compensating transistor MP1m is connected with the first branch through a switch K1m. The first signal Vin+ is input into gate electrodes of the PMOS compensating transistors MP11, MP12, . . . , and MP1m. The second compensating components correspond to a second branch and are connected with the second branch through corresponding switches. In some embodiments, the second compensating components are PMOS compensating transistors. A PMOS compensating transistor MP21 is connected with the second branch through a switch K21, a PMOS compensating transistor MP22 is connected with the second branch through a switch K22, . . . , and a PMOS compensating transistor MP2n is connected with the second branch through a switch K2n. The second signal Vin− is input into gate electrodes of the PMOS compensating transistors MP21, MP22, . . . , and MP2n.

In some embodiments, a size of the PMOS compensating transistors MP11, MP12, . . . , and MP1m and a size of the PMOS compensating transistors MP21, MP22, . . . , and MP2n are smaller than a size of the differential transistors MP1 and MP2. Sizes of the PMOS compensating transistors may be the same or different. In some embodiments, the sizes of the PMOS compensating transistors may be set according to requirements of compensating accuracy. For example, a ratio of the size of the PMOS compensating transistor to the size of the differential transistor may be 1:100, 2:100, 3:100, . . . , 1:10 or etc.

The switches K11, K12, . . . , and K1m are controlled by control signals CT11, CT12, . . . , and CT1m respectively, and the switches K21, K22, . . . , and K2n are controlled by control signals CT21, CT22, . . . , and CT2m respectively. If a logic value of the control signal is a first value, the corresponding switches are turned on and the corresponding compensating components are connected into the corresponding branch. If a logic value of the control signal is a second value, the corresponding switches are turned off and the corresponding compensating components are not connected with the corresponding branch.

In some embodiments, the logic values of the control signals may be determined based on predetermined control logic by a control circuit. More information about this can be found in the above description of FIG. 4.

Referring to the connecting structure in FIG. 7, for example, if it is determined that the second branch needs to be compensated according to the detection result, it is supposed that the reason may include a ratio of a size of the differential transistor MP1 to a current value of the current source I1 in the first branch is smaller than a ratio of a size of the differential transistor MP2 to a current value of the current source I2 in the second branch. Thus, a logic value of at least one of the control signals CT11, CT12, . . . , and CT1m may be determined as a first value, controlling at least one of the PMOS compensating transistors MP11, MP12, . . . , and MP1n to be connected in parallel with the differential transistor MP1 in the first branch. Voltage detection and branch compensation may be performed repeatedly, until an output voltage value equals to a reference voltage value or a smallest compensating accuracy of circuit design is achieved. During the voltage detection and branch compensation, the logic values of the control signals may be determined according to voltage detection results, to adjust the number of the compensating transistors which are connected in parallel with the differential transistor in the branch to be compensated and/or adjust the number of the compensating transistors which are connected in parallel with the differential transistor in the branch not to be compensated, which makes ratios of a size of the transistor to a current value of the current source in two branches equal or approach equal.

In some embodiments, in the differential circuit in FIG. 7, the compensating components in the compensating circuit may be compensating current sources. Those skilled in the art may design a connecting structure between the compensating current sources and the corresponding branch and control logic based on the above description of FIGS. 5 and 6.

In embodiments illustrated in FIGS. 4 to 7, the compensating circuit includes first compensating components and second compensating components which correspond to two branches respectively, and switches which correspond to the compensating components one-to-one. The number of the control signals is equal to that of the compensating components, that is, the control signals correspond to the compensating components one-to-one. In some embodiments, a compensating circuit may have other circuit structures. For example, the compensating circuit may include switches having different structures. The number of the switches and the number of the control signals may be different from the number of the compensating components. In some embodiments, a selective switch may be used to connect a compensating component to one branch selectively. When it is determined that the differential circuit needs to be compensated based on a detection result, the compensating component may be connected with the branch which needs to be compensated through the selective switch and disconnected from the branch which does not need to be compensated.

Besides, the compensating components may be not limited to MOS transistors or current sources. In some embodiments, the compensating components may be other electric components, such as resistors or triodes. The resistors or the triodes may be controlled by corresponding control signals to be connected in parallel with a differential transistor in a corresponding branch.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure. Therefore, the protection scope of the present disclosure is subject to the scope defined by the claims.

What is claimed is:

1. A circuit for suppressing audio output noise, comprising:
a detecting output stage configured to be connected with a first output stage of an audio power amplifier;
a detecting load configured to be connected with the detecting output stage, wherein the detecting output stage and the detecting load simulate an output voltage value of a second output stage of the audio power amplifier which immediately follows the first output stage of the audio power amplifier;
a detecting circuit, configured to be connected with the detecting output stage and compare the simulated output voltage value of the second output stage output by the detecting output stage with a reference voltage value to output a detection result;
a control circuit configured to output at least one control signal which is related to the detection result of the detecting circuit; and
a compensating circuit configured to compensate at least one output stage of the audio power amplifier based on the at least one control signal output by the control circuit, where the at least one output stage comes before the second output stage and comprises a differential circuit.

2. The circuit for suppressing audio output noise according to claim 1, the second output stage is an end output stage of the audio power amplifier.

3. The circuit for suppressing audio output noise according to claim 1, wherein the detecting circuit comprises a voltage comparing circuit, configured to compare the output voltage value with a reference voltage value to output the detection result.

4. The circuit for suppressing audio output noise according to claim 1, wherein the compensating circuit comprises at least one compensating component, where the control signal is configured to control the compensating component to connect with a corresponding branch in the differential circuit.

5. The circuit for suppressing audio output noise according to claim 4, wherein the compensating component is a transistor, the transistor being controlled to be connected in parallel with a differential transistor in a corresponding branch by a corresponding control signal.

6. The circuit for suppressing audio output noise according to claim 4, wherein the compensating component is a resistor, the resistor being controlled to be connected in parallel with a differential transistor in a corresponding branch by a corresponding control signal.

7. The circuit for suppressing audio output noise according to claim 4, wherein the compensating component is a current source, the current source being controlled to be connected in parallel with another current source in a corresponding branch by a corresponding control signal.

8. The circuit for suppressing audio output noise according to claim 4, wherein the compensating component is a current source, one end of the current source being controlled to be connected with another current source and a differential transistor in a corresponding branch by a corresponding control signal, and the other end of the current source being grounded.

9. The circuit for suppressing audio output noise according to claim 1, wherein the compensating circuit comprises at least one compensating component which corresponds to one branch of the differential circuit and at least one compensating component which corresponds to another branch of the differential circuit, where connection between the compensating components and the corresponding branches in the differential circuit is controlled by a corresponding control signal.

10. The circuit for suppressing audio output noise according to claim 9, wherein the compensating component is a transistor, the transistor being controlled to be connected in parallel with a differential transistor in a corresponding branch by a corresponding control signal.

11. The circuit for suppressing audio output noise according to claim 9, wherein the compensating component is a resistor, the resistor being controlled to be connected in parallel with a differential transistor in a corresponding branch by a corresponding control signal.

12. The circuit for suppressing audio output noise according to claim 9, wherein the compensating component is a current source, the current source being controlled to be connected in parallel with another current source in a corresponding branch by a corresponding control signal.

13. The circuit for suppressing audio output noise according to claim 9, wherein the compensating component is a current source, one end of the current source being controlled to be connected with another current source and a differential transistor in a corresponding branch by a corresponding control signal, and the other end of the current source being grounded.

14. The circuit for suppressing audio output noise according to claim 1, wherein the control circuit is configured to determine which branch in the differential circuit of the at least one output stage to be compensated based on the detection result, and to set a logical value for the control signal.

15. The circuit for suppressing audio output noise according to claim 1, wherein the audio power amplifier is a class G audio power amplifier.

16. An audio output circuit, comprising an audio power amplifier, a loudspeaker and the circuit for suppressing audio output noise according to claim 1.

17. The audio output circuit according to claim 16, wherein the loudspeaker is an earphone or a bugle.

* * * * *